United States Patent [19]

Schmidt et al.

[11] Patent Number: 5,452,499
[45] Date of Patent: Sep. 26, 1995

[54] SUBSTRATE ALIGNMENT AND RETAINER CLIP

[75] Inventors: Detlef W. Schmidt, Schaumburg; Greg M. Gutierez, Elgin, both of Ill.

[73] Assignee: Motorola, Inc., Schaumburg, Ill.

[21] Appl. No.: 147,365

[22] Filed: Nov. 5, 1993

[51] Int. Cl.⁶ .............................. A44B 17/00; H05K 7/00
[52] U.S. Cl. .................... 24/453; 24/297; 174/138 D; 411/508
[58] Field of Search ............... 24/453, 297; 174/138 D; 411/508, 509, 510, 913, 182, 438; 439/74

[56] References Cited

U.S. PATENT DOCUMENTS

| | | | |
|---|---|---|---|
| 615,795 | 12/1898 | Brinkerhoff | 24/453 |
| 2,110,959 | 3/1938 | Lombard | 24/453 |
| 2,155,496 | 4/1939 | Lane | 24/453 |
| 2,186,586 | 1/1940 | Kamen | 24/453 |
| 2,658,248 | 11/1953 | Kost | 411/527 |
| 3,024,509 | 3/1962 | Hamann | 24/453 |
| 3,271,059 | 9/1966 | Pearson | 24/453 |
| 3,996,500 | 12/1976 | Coules | 174/138 D |
| 4,473,204 | 9/1984 | Bohm | 174/138 D |
| 5,281,149 | 1/1994 | Petri | 174/138 D |

FOREIGN PATENT DOCUMENTS 0770679  3/1957  United Kingdom ............... 24/453

Primary Examiner—Victor N. Sakran
Attorney, Agent, or Firm—Anthony G. Sitko

[57] ABSTRACT

A substrate alignment and retainer clip (10, 20) is provided which includes an anchor (12, 13, 40), a retainer (11, 42), and a biasing device (11, 41), joining and aligning the anchor (12, 13, 40) and retainer (11, 42), for biasing the retainer (11, 42) towards the anchor (12, 13, 40).

1 Claim, 1 Drawing Sheet

SUBSTRATE ALIGNMENT AND RETAINER CLIP

FIELD OF THE INVENTION

The field of the invention relates to circuit board devices and more particularly to alignment and retaining devices for hybrid circuit board assemblies.

BACKGROUND OF THE INVENTION

Hybrid circuit board assemblies are known. Such assemblies are typically comprised of a number of ceramic substrates attached by solder or otherwise to a mother-board (e.g., a copper heatsink or other mounting structure).

Electrical devices on the substrates are powered by and interconnected with other devices on the substrate through the use of copper traces printed on the substrates. Interconnections among substrates (and physical attachment of the substrate to the mother-board) is accomplished by re-flow soldering the substrates to the mother-board. Where a number of substrates must be assembled into a single hybrid circuit board assembly, the substrates must be secured and aligned with the mother-board during the re-flow soldering process. Securing and aligning the ceramic boards to the mother-board during the soldering process is necessary to ensure the integrity of circuit connections created during the re-flow process.

Past efforts at securing and aligning substrates to the mother-board during the soldering process have included the construction of fixtures, sized to hold the mother-board and any ceramic boards to be attached to the mother-board. While the use of soldering fixtures has proven effective, the construction and maintenance of soldering fixtures is expensive. Further, changes to hybrid circuit boards often require re-working alignment fixtures requiring further expense. Because of the importance (and prevalence) of hybrid circuit boards in consumer goods (e.g., cellular radiotelephones) and associated infrastructure (e.g., radio frequency base stations) a needs exists for a more efficient method of securing and aligning ceramic boards within hybrid circuit board assemblies during the re-flow soldering process.

DETAILED DESCRIPTION OF THE PREFERRED EMBODIMENT

The solution to the problem of aligning and securing ceramic boards to the mother-board during the construction of hybrid circuit board assemblies lies conceptually in the use of self-anchoring, deformable clips inserted through the ceramic board into the mother-board. The self-anchoring deformable clips are inserted into holes drilled in the ceramic board and mother-board. Anchoring of the clips is accomplished by forming barbs on an outside surface of the clips during fabrication. Engagement of the ceramic board by the clip is accomplished through the use of a resilient tab extending from the clip and deflecting upon insertion of the clip into the hole thereby biasing the ceramic board against the mother-board during the soldering process. Alignment of the ceramic substrate and mother-board is accomplished by the interaction of the clip with corresponding holes in the ceramic substrate and mother-board.

Figure 1:
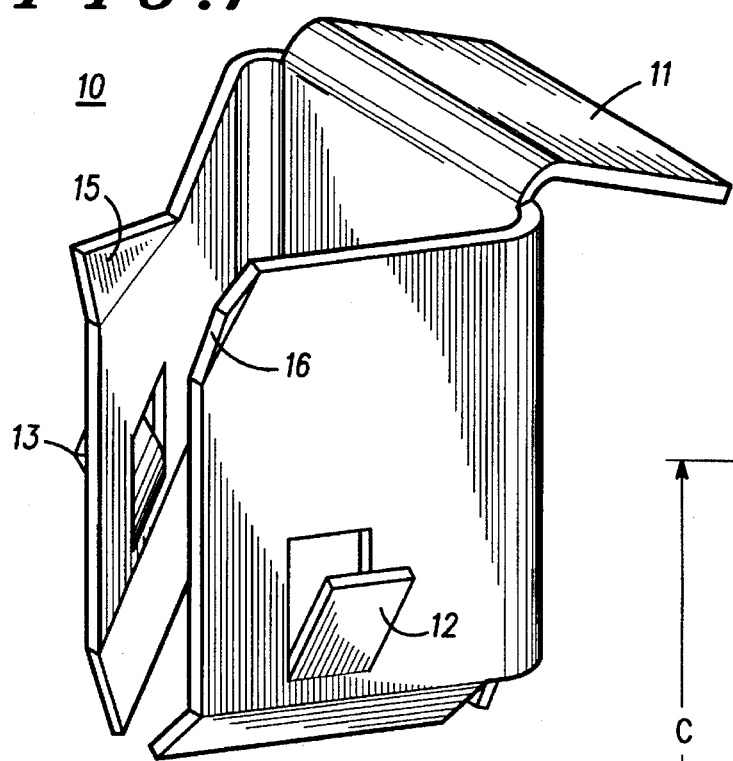
FIG. 1 is a three-dimensional view of an alignment and retainer clip in accordance with the invention.

FIG. 1 is a three dimensional view of the clip, generally 10, in accordance with an embodiment of the invention. The clip 10 is constructed with a resilient tab 11 at a first end and a set of barbs 12, 13 at a second end. The resilient tab 11 is cantilevered from the first end of the clip 10 such that an axis of resiliency of the tab 11 is orthogonal to an axis passing through the first and second ends of the clip 10. The clip 10 further has formed first and second ears 15 and 16 at the first end.

Figure 2:
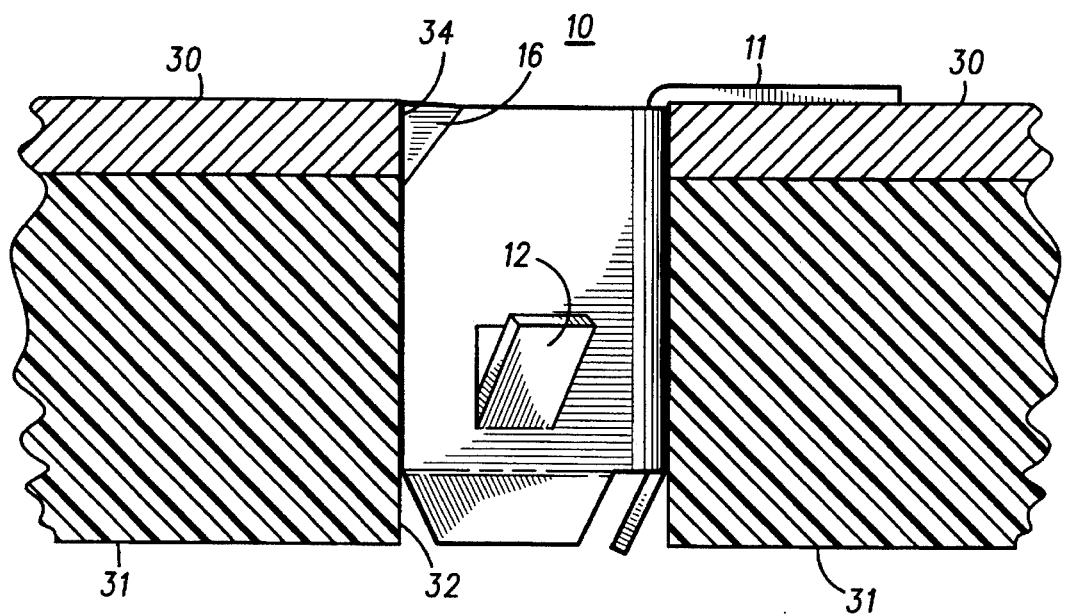
FIG. 2 is a cut-away view of a ceramic circuit board, mother-board, and alignment and retaining clip.

FIG. 2 is a cut-away view of a hybrid circuit board assembly with a clip 10 inserted into a hole 32 bored into a ceramic substrate 30 and mother-board 31. Upon insertion, the resilient tab 11 deflects to a point where a plane of the tab 11 is substantially orthogonal to the axis passing through the first and second ends of the clip 10. The tab 11 is maintained in the deflected state by an anchor at the second end of the clip 10 comprising the barbs 12, 13 and anchoring the clip 10 into the mother-board 31. The deflection of the tab 11 stores sufficient energy to bias the ceramic substrate 30 towards the mother-board 31 after insertion of the clip 10 into the hole 32.

The barbs 12, 13 at the second end of the clip 10 are constructed to deflect towards the axis of the first and second ends upon insertion into a hole 32 of the ceramic substrate 30 and mother-board 31. The deflection of the barbs 12, 13 provides a means of accommodating slight differences in diameter between the clip 10 and the hole 32. The deflection of the barbs 12, 13 also causes the barbs 12, 13 to engage and anchor the clip 10 into the mother-board 31.

Alignment of the ceramic substrate 30 to the mother-board 31 is accomplished by a proper matching of the overall diameter of the hole 32 with the clip 10 and by a slight deflection and compression of the clip 10 at an open end (apex) of the triangular cross-section of the clip 10 during insertion into the hole 32. The barbs 12, 13 on either side of the apex of the cross-section and two points of contact at the opposing side of the cross-section from the apex provide a stable mechanism for anchoring the clip 10 into the hole 32. Also, ears 15 and 16 act to engage an aperture 34 formed in ceramic substrate 30, which may due to tolerances be larger than hole 32 formed in mother board 31, for ensuring alignment of ceramic substrate 30 to mother board 31. Close alignment of the ceramic substrate to the mother board is important for ensuring proper soldering therebetween.

Figure 3:
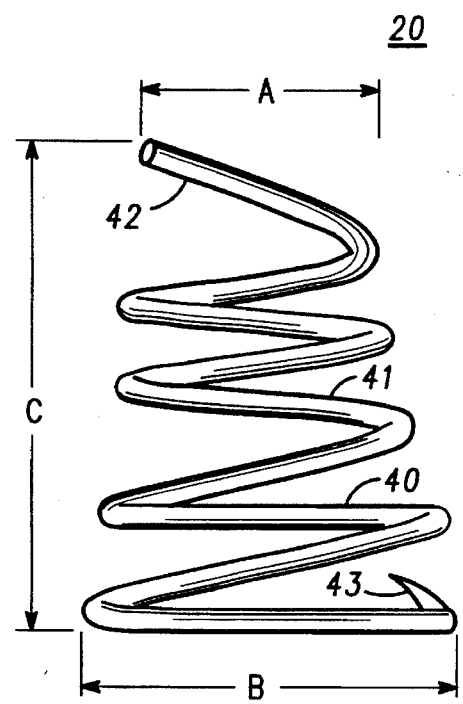
FIG. 3 is a side view of an alignment and retainer clip in accordance with an alternate embodiment of the invention.

In another embodiment of the invention (FIG. 3) a substrate aligning and retaining clip 20 is fabricated of coil spring material of a first diameter, a, at a first end and a second diameter, b at a second end. The first diameter, a, is chosen to substantially match the hole 32 within the ceramic substrate 30 and mother-board 31. The second diameter, b, is chosen to be slightly larger than the diameter of the hole 32 in the mother-board to act as an anchor, anchoring the aligning and retaining clip 20 to the mother-board. The slightly larger diameter, b, of the second end of the clip 20 provides an interference fit between the second end of the clip 20 and the mother-board firmly anchoring the second end of the clip 20 to the mother-board.

On the first end 42 of the clip 20 a retainer 42 is fabricated of a straightened portion of the coil spring extending tangentially from the coil spring. Upon insertion of the clip 20 into the hole 32 the retainer 42 engages the ceramic substrate 30 while the anchor 40 engages the mother-board 31. By selecting a proper length, c, of the clip 20, the anchor 40 will engage the mother-board 30 at a sufficient depth as to cause the coil spring material 41 at the first end to stretch. The stretching of the spring material 41 at the first end biases the retainer 42 and ceramic substrate 30 against the mother-board 31.

Installation of the clip 20 into the ceramic substrate 30 and mother-board 31 is aided by fabricating an insertion handle at the second end of the clip 20. The insertion handle 43 is created by bending a portion of the spring material, radially, towards the center of the spring at the second end of the clip 20.

Installation of the clip 20 is accomplished by inserting an installation tool (not shown) through the center of the clip 20 from the first end to engage the insertion handle at the second end. Force applied by the installation tool to the insertion handle 43 causes the diameter of the clip 20 at the second end 40 to compress sufficiently to pass through the hole 32 within the ceramic substrate 30 and into the mother-board 31. Upon release of the clip 20 by the insertion tool the coil spring material 40 at the second end of the clip 20 expands to engage and anchor the second end 40 of the clip 20 to the mother-board 31.

The many features and advantages of this invention are apparent from the detailed specification and thus it is intended by the appended claims to cover all such features and advantages of the system which fall within the true spirit and scope of the invention. Further, since numerous modifications and changes will readily occur to those skilled in the art (e.g., a coil spring clip with retainers on both ends), it is not desired to limit the invention to the exact construction and operation illustrated and described, and accordingly all suitable modifications and equivalents may be resorted to, falling within the scope of the invention.

It is, of course, to be understood that the present invention is, by no means, limited to the specific showing in the drawing, but also comprises any modification within the scope of the appended claims.

We claim:

1. A substrate alignment and retainer clip comprising:

a body including a metallic strip formed into a triangular cross-section having a base leg and first and second legs forming acute angles to the base leg, the body extending along an axis in a longitudinal direction and further having a first end and a second end; a resilient tab formed from the base leg at the first end having a plane forming an acute angle with the axis; at least one barb formed in each of the first and second legs and disposed proximate the second end; and first and second ears formed in the first and second legs, respectively, proximate the first end and extending outwardly from the axis, whereby the second end and at least one barb engage an aperture formed in a mother board, and the first and second ears engage an aperture formed in the substrate for aligning the substrate to the mother board.

\* \* \* \* \*